United States Patent [19]

Kunitaka

[11] Patent Number: 5,220,289

[45] Date of Patent: Jun. 15, 1993

[54] DIFFERENTIAL AMPLIFIER CIRCUIT

[75] Inventor: Mori Kunitaka, Tokyo, Japan

[73] Assignee: NEC Corporation, Tokyo, Japan

[21] Appl. No.: 796,357

[22] Filed: Nov. 22, 1991

[30] Foreign Application Priority Data

Nov. 22, 1990 [JP] Japan .................................. 2-318251

[51] Int. Cl.⁵ .............................................. H03F 3/45
[52] U.S. Cl. .................................... 330/257; 330/261
[58] Field of Search ................ 330/252, 257, 259, 261, 330/288, 290, 296

[56] References Cited

U.S. PATENT DOCUMENTS 4,451,800  5/1984  Nishioka et al. ..................... 330/261
5,015,967  5/1991  Bichler ................................ 330/257

Primary Examiner—Steven Mottola
Attorney, Agent, or Firm—Sughrue, Mion, Zinn, Macpeak & Seas

[57] ABSTRACT

A differential amplifier circuit includes a differential amplifier unit powered by a power source voltage and supplied with a drive current for producing a differential output. A current source composed of a current mirror circuit is connected for supplying the drive current to the differential amplifier unit. A current control unit is provided for varying the drive current in proportion to the power source voltage.

4 Claims, 6 Drawing Sheets

DIFFERENTIAL AMPLIFIER CIRCUIT

BACKGROUND OF THE INVENTION

The present invention relates to a differential amplifier circuit, and more specifically relates to stabilization technology of an output voltage of the amplifier circuit.

Referring to FIG. 1, a conventional differential amplifier circuit includes a differential amplifier unit having an emitter circuit comprised of transistors Q1 and Q2. A current mirror circuit comprised of transistors Q3 and Q4 is used as a current source for the emitter circuit. As shown in FIG. 1, a current $I_0$ flowing into the current mirror circuit is controlled by a circuit comprised of a transistor Q5, resistors R7, R8 and a diode $ZD_1$.

FIG. 2 shows another example of a conventional differential amplifier circuit, in which a current $I_0$ flowing into the same type of a current mirror circuit is controlled by a circuit comprised of transistors Q4 and Q5, resistors R6, R7 and R8, and a diode $ZD_2$.

In either of the two conventional circuits, the current $I_0$ flowing through the resistor R7 is held constant regardless of a variation in a power source voltage $V_p$. This current $I_0$ drives the current mirror circuits. In FIGS. 1 and 2, $V_n$ indicates a negative power source.

These conventional differential amplifier circuits are controlled such that the current flowing into the differential amplifier unit is held constant even when the power source voltage Vp varies. Consequently, a voltage drop across output resistors R1 and R2 of the differential amplifier unit is kept constant. Therefore, when the positive power source voltage Vp varies, the voltage variation directly appears in outputs $+V_0$ and $-V_0$ of the differential amplifier unit. Generally, the output of the differential amplifier unit is utilized in the form $(+V_0) - (-V_0)$, hence the above noted variation of the power source voltage contained in $+V_0$ and $-V_0$ cancel each other, thereby causing no drawback. However, in some applications in which the differential amplifier circuit may be utilized, for example as a comparator, only one of the outputs is used. In such a case, a DC offset of the output may vary disadvantageously with the variation in the power source voltage. Further, when the power source contains noise, disadvantageously the noise would be directly outputted.

SUMMARY OF THE INVENTION

An object of the present invention is to eliminate the above noted drawbacks of the prior art. According to the invention, the differential amplifier circuit is provided with a current source having an output which varies according to a variation in the power source voltage.

DETAILED DESCRIPTION OF PREFERRED EMBODIMENTS

Figure 1:
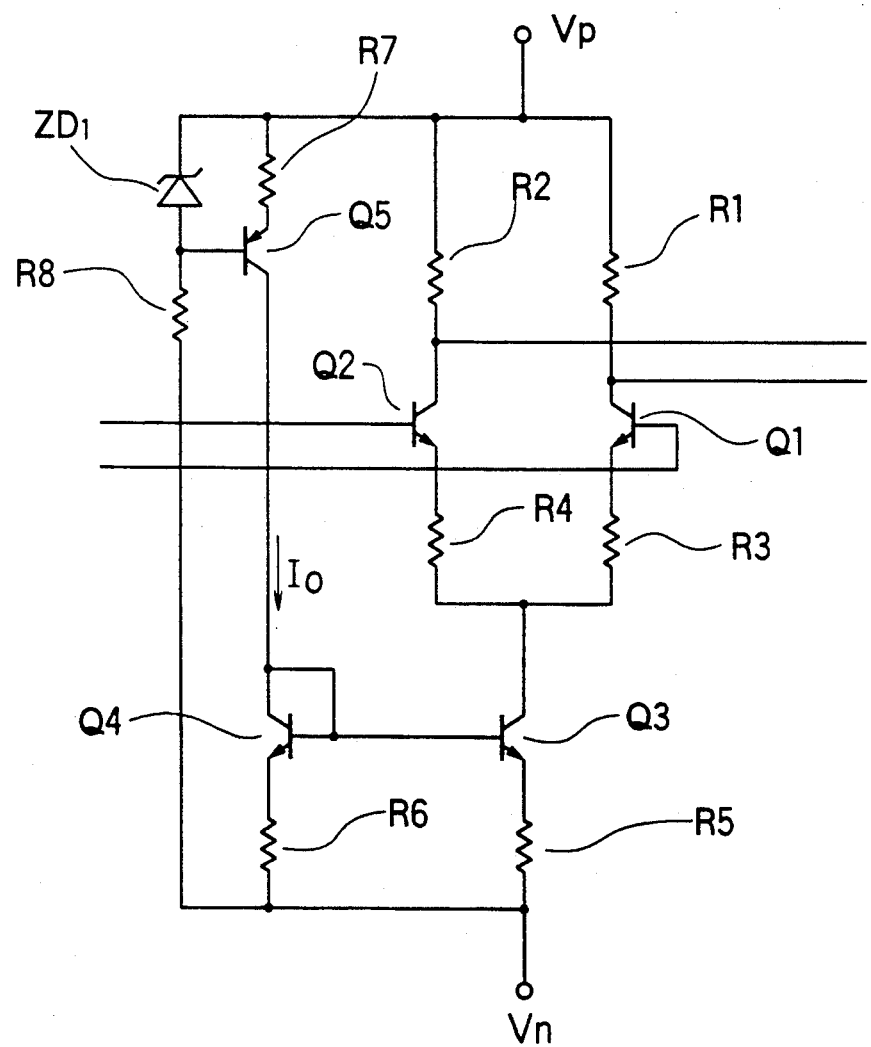
FIGS. 1 and 2 are circuit diagrams showing the prior arts.
Figure 2:
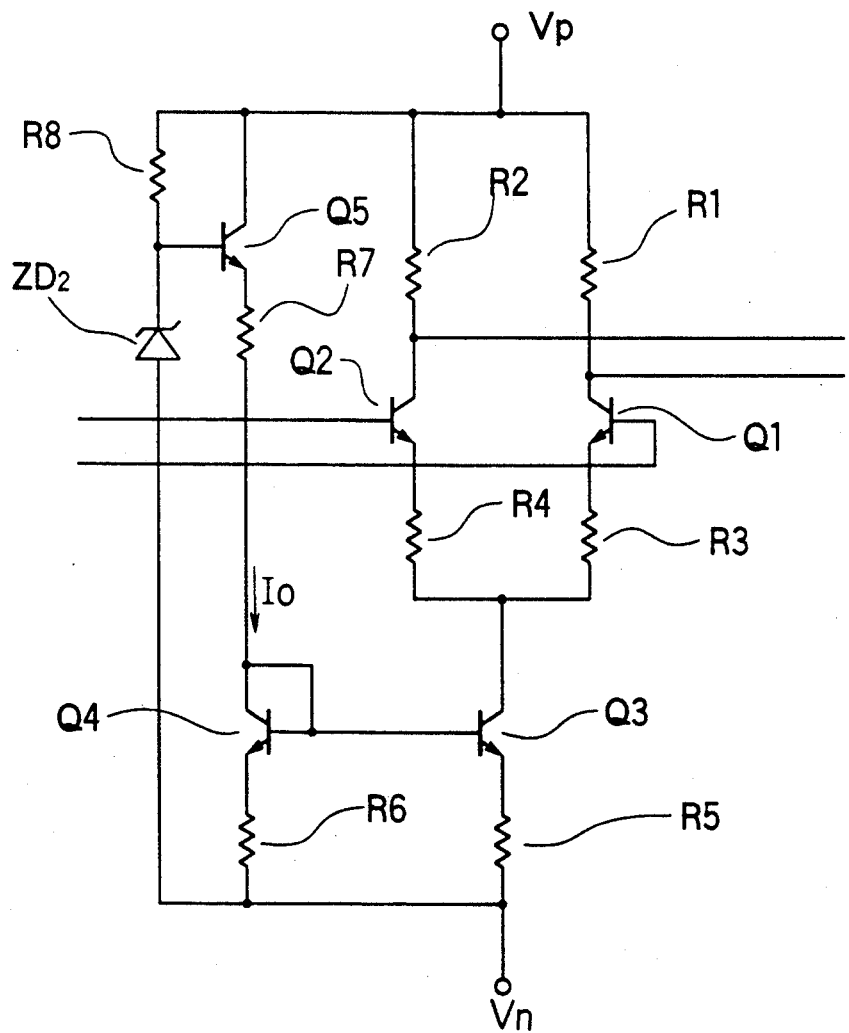

Embodiments of the present invention will be described referring to the drawings.

Figure 3:
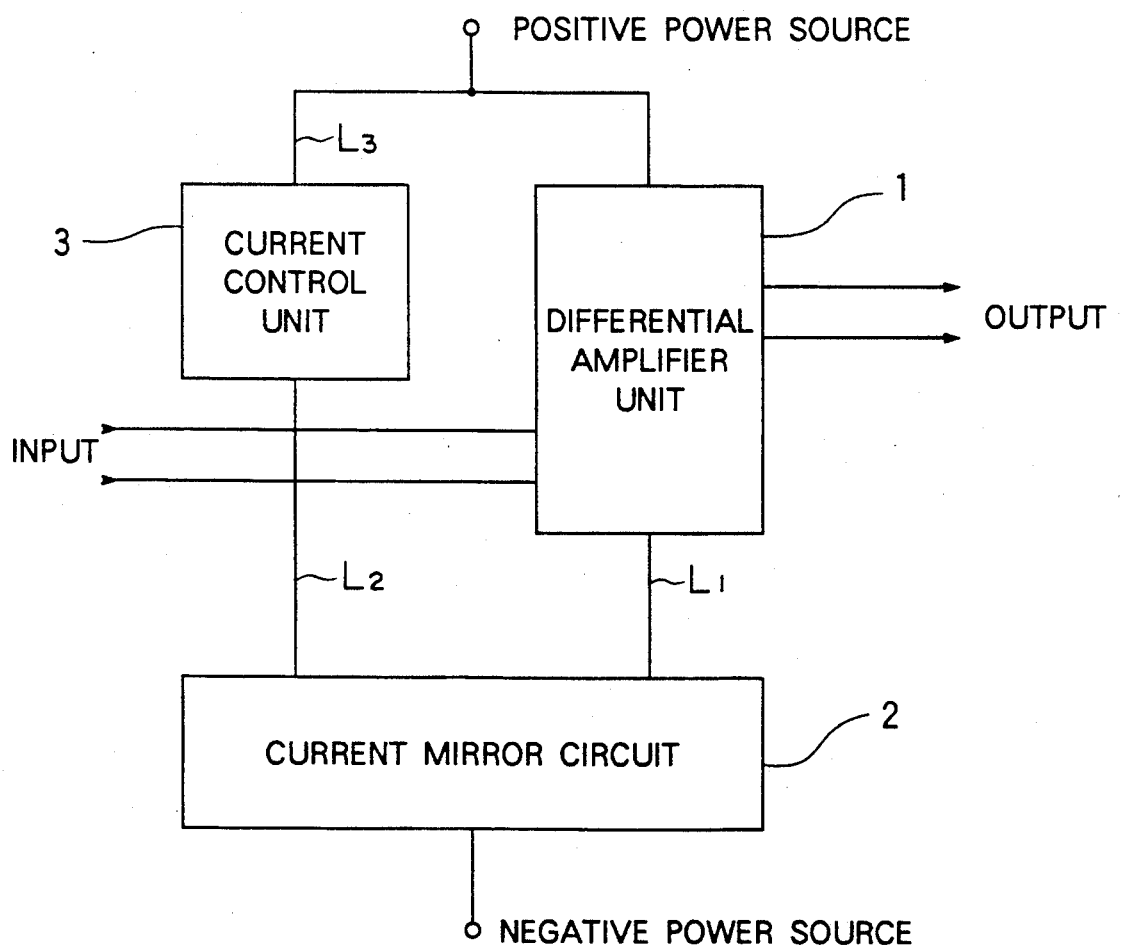
FIG. 3 is a block diagram showing one embodiment of the present invention.

FIG. 3 is a block diagram showing a structure of one embodiment according to the invention. A differential amplifier unit 1 is connected to a current source in the form of a current mirror circuit 2 via a line $L_1$. A current control unit 3 is also connected to the current mirror circuit 2 via a line $L_2$. The current mirror circuit 2 supplies a drive current which is identical to that supplied by the current control unit 3 to the differential amplifier unit 1. This current control unit 3 operates to supply a current in proportion to variations of a power source voltage across positive and negative power source terminals. Accordingly, the current mirror circuit 2 supplies the drive current to the differential amplifier unit 1. The current is controlled so as to cancel the variation in the amplifier output voltage which would be caused by a variation in the power source voltage.

Figure 4:
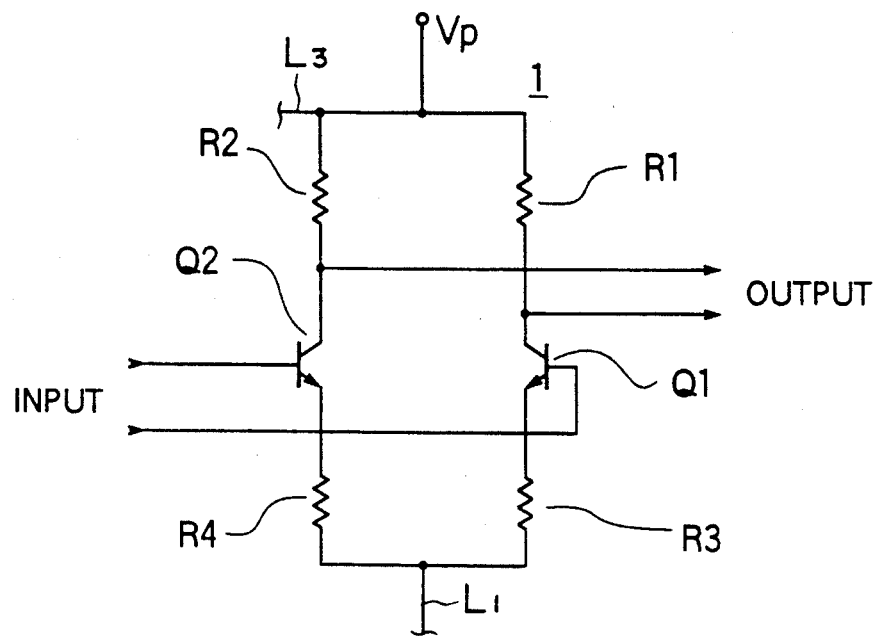
FIG. 4 is a circuit diagram of a differential amplifier unit (1) contained in the embodiment of FIG. 3.

FIG. 4 shows one example of the differential amplifier unit 1. Inputs of the amplifier unit are applied to respective bases of transistors Q1 and Q2. Collectors of the transistors Q1 and Q2 are connected, respectively, to collector resistors R1 and R2 which are connected to the positive power source $V_P$ via a line $L_3$. Emitters of the transistors Q1 and Q2 are connected, respectively, to emitter resistors R3 and R4 which are connected to the current mirror circuit 2 (not shown in the figure) via the line $L_1$.

Figure 5:
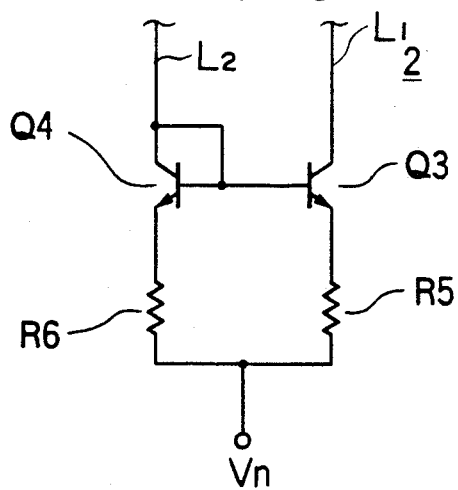
FIG. 5 is a circuit diagram of a current mirror circuit (2) contained in the embodiment of FIG. 3.

FIG. 5 shows an example of the current mirror circuit 2. An emitter of transistor Q3 is connected to a resistor R5 which is connected to the negative power source $V_n$. A base of the transistor Q3 is connected to a base and a collector of a transistor Q4. An emitter of the transistor Q4 is connected to a resistor R6 which is connected to the negative power source $V_n$. A collector of the transistor Q3 is connected to the differential amplifier unit 1 (not shown in the figure) via the line $L_1$. A collector of the transistor Q4 is connected to the current control unit 3 (not shown in the figure) via the line $L_2$.

Figure 6:
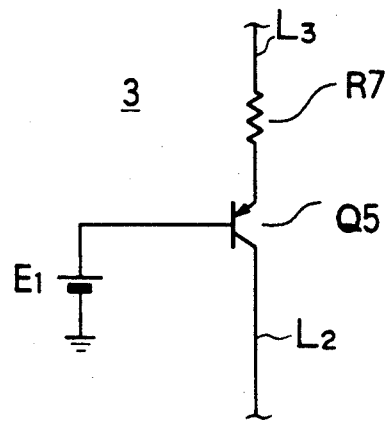
FIG. 6 is a circuit diagram showing a first example of a current control unit (3) contained in the embodiment of FIG. 3.

FIG. 6 shows one example of the current control unit 3. A transistor Q5 is of the PNP type and has an emitter connected to the positive power source $V_P$ through a resistor R7 and the line $L_3$. A base of the transistor Q5 is supplied with a constant reference voltage E1. A collector of the transistor Q5 is connected to the current mirror circuit 2 (not shown in the figure) via the line $L_2$.

Figure 7:
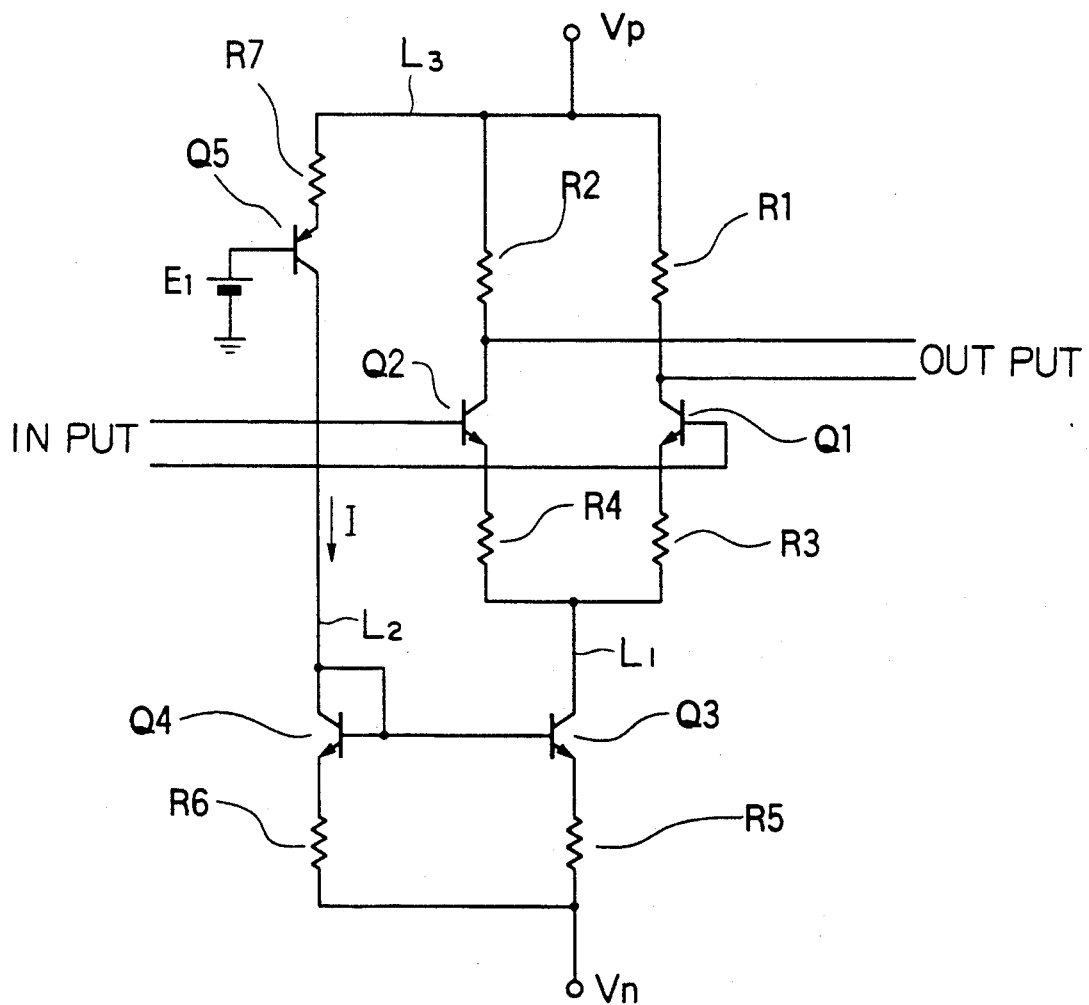
FIG. 7 is an overall circuit diagram of the embodiment of FIG. 3.

Referring to FIG. 7, the description is given for the operation of the present embodiment. All of the transistors have a direct current amplification coefficient hfe which is far greater than value 1. When the resistors R5 and R6 of the current mirror circuit 2 have the same resistance value, a collector current of the transistor Q3 is equal to that of the transistor Q4. The collector current of the transistor Q4 is identical to that of the transistor Q5 of the current control unit. The value I of this current is represented by:

$$I = (V_P - V_{BE5} - E_1)/R7$$

wherein $V_P$ denotes a positive power source voltage and $V_{BE5}$ denotes a base-emitter voltage of the transistor Q5. As described above, this current value I is identical to the collector current value of the transistor Q3. When inputs of the differential amplifier unit are at the same voltage, the current flowing through the resistor R1, transistor Q1 and the resistor R3 has a value identical to that of the current flowing through the resistor R2, transistor Q2 and resistor R4. The value of these currents is I/2. Accordingly, the DC output voltage $V_0$ of this differential amplifier unit is represented by:

$$V_0 = V_P - R1 \times I/2$$
$$= V_P - R1 \times (V_P - V_{BE5} - E_1)/(2 \times R7)$$

Provided that the positive power source voltage $V_P$ varies by $\Delta V_P$, the DC output voltage $V_O$ would vary by $\Delta V_P$ if the current I was held constant without regard to the positive power source voltage $V_P$. On the other hand, the current control unit of the present embodiment operates such that the current is controllably changed as represented by:

$$\Delta I = \Delta V_P / R7$$

in proportion to the variation $\Delta V_P$ of the positive power source voltage $V_P$. Accordingly, the variation $\Delta V_0$ in the DC output voltage $V_0$ is suppressed as represented by:

$$\Delta V_O = \{1 - R1/(2 \times R7)\} \times \Delta V_p$$

In this embodiment, if the resistance value of the resistor R7 of the current control unit 3 is set to half of the resistance value of the resistor R1 of the differential amplifier unit, the DC output voltage $V_0$ is represented by:

$$V_0 = V_{BE5} + E_1$$

thereby perfectly eliminating the affect of the variation in the positive power source voltage $V_P$, when the inputs of the differential amplifier unit are at the same voltage. Namely, by setting a ratio of the resistance value of the resistor R1 to the resistance value of the resistor R7, it is possible to secure stability of the outputs of the differential amplifier unit in a certain state (in the above-mentioned embodiment, in such a state that the inputs of the differential amplifier unit are at the same voltage). Accordingly, it is expedient to set the ratio of the resistance value of the resistor R1 to the resistance value of the resistor R7 according to the state that the stability is required in the circuit for using the above differential amplifier unit.

For example, when the circuit of the present embodiment is applied to a comparator in which the transistors Q1 and Q2 are switched, it is expedient to set the resistance value of the resistor R1 of the differential amplifier unit 1 identically to that of the resistor R7 of the current control unit 3. By such settings, the DC output voltage $V_0$ is made identical to the positive power source voltage $V_0$ at the high level state, and is held at $V_0 = V_{BE5} + E_1$ at low level state. Generally, it is necessary that the output voltage should be close to zero volts at the low level state in the comparator, hence $E_1$ is set identical to $-V_{BE5}$ to ensure a highly stable low level output of zero volts.

Figure 8:
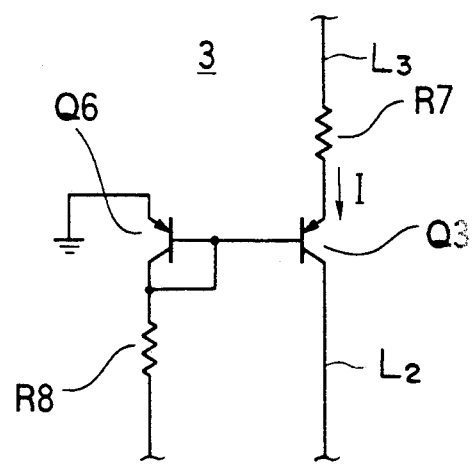
FIG. 8 is a circuit diagram showing a second example of the current control unit (3) contained in the embodiment of FIG. 3.

FIG. 8 shows another example of the current control unit 3. An emitter of a transistor Q6 is grounded to a zero volt level. A base of the transistor Q6 is connected to its collector, and is connected to the transistor Q5 and a resistor R8. Another end of the resistor R8 is connected to the negative power source $V_n$. The resistance value of the resistor R8 is set such that a current flowing through the resistor R8 is made identical to the current I flowing through the resistor R7 so as to further improve operating accuracy. In this circuit, the voltage $V_{BE6}$ between the base and the emitter of the transistor Q6 is applied to the base of the transistor Q5. Namely, this voltage is equivalent to E1 shown in FIG. 7 as represented by $E_1 = V_{BE6} \approx V_{BE5}$. Accordingly, when the circuit is operated as a comparator, the low level output voltage can be easily stabilized to the zero volt level.

As described above, according to the present invention, the differential amplifier circuit is constructed as defined by the claims, such as to advantageously stabilize constantly a DC output voltage thereof independently of variation in the power source voltage.

What is claimed is:

1. A differential amplifier circuit comprising,
   a differential amplifier unit including an emitter circuit,
   a current source composed of a current mirror circuit connected to said emitter circuit, and
   a current control unit for controlling a current which flows into said current mirror circuit in proportion to a positive power source voltage, said current control unit including a first resistor connected to a positive power source, a first transistor having an emitter connected to said first resistor, a second transistor having an emitter held at a constant voltage, a base and a collector of said second transistor being coupled to each other and to a base of said first transistor, and a second resistor connected to said collector of said second transistor for biasing said second transistor.

2. A differential amplifier circuit as claimed in claim 1, wherein said first resistor has a resistance value set to a half of a resistance value of a collector resistor contained in said differential amplifier unit.

3. A differential amplifier circuit as claimed in claim 1, wherein said first resistor has a resistance value set identically to a resistance value of a collector resistor contained in said differential amplifier unit.

4. A differential amplifier circuit as claimed in claim 1, wherein said second resistor has a resistance value set such that there flows therethrough a current which is identical to a current flowing through said first resistor.

* * * * *

UNITED STATES PATENT AND TRADEMARK OFFICE
CERTIFICATE OF CORRECTION

PATENT NO. : 5,220,289
DATED : June 15, 1993
INVENTOR(S) : Mori Kunitaka

It is certified that error appears in the above-indentified patent and that said Letters Patent is hereby corrected as shown below:

Title page, item [19], inventor's last name should be -- Mori --;
item [75], inventor's name, delete "Mori Kunitaka" and insert --Kunitaka Mori--.

Signed and Sealed this

Sixteenth Day of August, 1994

Attest:

BRUCE LEHMAN

*Attesting Officer*       *Commissioner of Patents and Trademarks*